US006804882B2

(12) United States Patent
Toi et al.

(10) Patent No.: US 6,804,882 B2
(45) Date of Patent: Oct. 19, 2004

(54) METHOD FOR MANUFACTURING A COIL DEVICE

(75) Inventors: Takaomi Toi, Sabae (JP); Koki Sasaki, Fukui (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 318 days.

(21) Appl. No.: 10/197,855

(22) Filed: Jul. 19, 2002

(65) Prior Publication Data

US 2002/0180574 A1 Dec. 5, 2002

Related U.S. Application Data

(62) Division of application No. 09/648,168, filed on Aug. 25, 2000, now Pat. No. 6,480,083.

(30) Foreign Application Priority Data

Aug. 26, 1999 (JP) .......................................... 11-239434

(51) Int. Cl.[7] .................................................. H05K 3/30

(52) U.S. Cl. .......................... 29/832; 29/602.1; 29/840; 29/846; 336/107; 427/430.1; 427/601

(58) Field of Search ............................ 29/592.1, 602.1, 29/606, 832, 840, 846, 885; 336/65, 83, 90, 96, 107, 192, 200; 427/81, 96, 98, 125, 226, 229, 600, 601, 430.1; 205/137

(56) References Cited

U.S. PATENT DOCUMENTS

| | | | | | |
|---|---|---|---|---|---|
| 3,585,553 | A | * | 6/1971 | Muckelroy et al. | 336/192 |
| 5,003,279 | A | | 3/1991 | Morinaga et al. | |
| 6,027,008 | A | * | 2/2000 | Toi et al. | 228/10.1 |

FOREIGN PATENT DOCUMENTS

| | | | | |
|---|---|---|---|---|
| JP | 09219333 A | * | 8/1997 | H01F/41/04 |

* cited by examiner

*Primary Examiner*—A. Dexter Tugbang
*Assistant Examiner*—Donghai D. Nguyen
(74) *Attorney, Agent, or Firm*—Keating & Bennett LLP

(57) ABSTRACT

A coil device includes terminal electrodes each including a bottom-surface electrode provided on a bottom surface of a flange, side-surface electrodes provided on side surfaces of the flange, and an end-surface electrode provided on an end surface of the flange at the lower part of the end surface. The end-surface electrode is arranged on the end surface of the flange so that the upper edge of the end-surface electrode is disposed at a first level that is substantially the same as that of the upper edges of the side-surface electrodes in the vicinity of boundaries between the end surface and each side surface of the flange and is disposed at a second level lower than the first level at an approximate central portion of the end surface of the flange.

15 Claims, 6 Drawing Sheets

METHOD FOR MANUFACTURING A COIL DEVICE

This application is a Divisional of U.S. patent application Ser. No. 09/648,168 filed Aug. 25, 2000, now U.S. Pat. No. 6,480,083 B1.

BACKGROUND OF THE INVENTION

1. Field of the Invention

The present invention relates to coil devices having wires wound around cores and to a method for manufacturing the same. More particularly, the present invention relates to a wire-wound coil device provided with terminal electrodes on flanges provided at the ends of the reel of a core.

2. Description of the Related Art

As shown in FIG. 8, a typical wire-wound coil device has a core 53 including a reel 51, a pair of flanges 52 disposed at the ends of the reel 51, a wire 54 wound around the reel 51, and terminal electrodes 55 provided at the lower portions of the flanges 52 and connected to the ends of the wire 54.

A problem has been found in the above-described wire-wound coil device in that as the size of the coil device is reduced, the area of the terminal electrodes 55 (i.e., the size of electrodes) is reduced, and therefore, adhesion of the coil device, when mounted on a printed circuit board or other device by soldering, is reduced, thereby lowering reliability when the coil device is mounted.

Other typical wire-wound coil devices have configurations, for example, as described below.

A coil device shown in FIG. 9 is configured such that each terminal electrode 55 provided on a leg 56 of a core 53 is provided such that the terminal electrode 55 is disposed to cover the leg 56 to a level of an end surface 56*a* (the outer surface) which is higher than that of a surface 56*b* (the inner surface) opposite to the end surface 56*a* of the leg 56, and the upper edges of the terminal electrode 55 are inclined at side surfaces 56*c* (the remaining side surfaces) of the leg 56.

Another coil device shown in FIG. 10 is configured such that the terminal electrodes 55 are disposed on a pair of flanges 52 provided at the ends of the core 53 so that each terminal electrode 55 extends over an entire bottom surface 52*a* to an end surface 52*c* of the flange 52.

The components referred to in FIGS. 9 and 10 are the same as or have the same functions as the component shown in FIG. 8.

In the coil device shown in FIG. 9, the terminal electrodes 55 are located at a high level of each outer end 56*a* of the legs 56 so as to increase the size of the electrodes, thereby improving an adhesive effect in the mounted state by soldering.

In the coil device shown in FIG. 10, the terminal electrodes 55 are arranged to extend over the entire bottom surface 52*a* to the end surface 52*c* of the pair of flanges 52 provided at the ends of the core 53 so as to increase the size of the electrodes, thereby improving an adhesive effect in the mounted state by soldering.

In the coil devices of FIGS. 9 and 10, the terminal electrodes 55 are arranged to extend to a high level of the outer end surfaces 56*a* of the legs 56 (see FIG. 9) or to a high level of the outer end surfaces 52*c* of the flanges 52 (see FIG. 10), respectively. In this case, the terminal electrodes 55 provided on the outer end surfaces 56*a* of the legs 56 in FIG. 9 or on the outer end surfaces 52*c* of the flanges 52 in FIG. 10 vertically interrupt magnetic fluxes, thereby adversely affecting the Q factor.

When an electrode is provided, as in the coil devices shown in FIGS. 9 and 10, having the upper edges thereof being disposed at different levels, the manufacturing cost is increased because the device to be manufactured must be maintained inclined during the manufacturing process, or a particular paste-applying device for pasting the electrode must be used.

In addition to the increased cost, the manufacturing process is complex. As the size of the device is further reduced, the manufacturing process of the coil device having the configuration shown in FIGS. 9 and 10 in which the upper edges of the electrode are disposed at different levels becomes increasingly difficult.

SUMMARY OF THE INVENTION

To overcome the above-described problems, preferred embodiments of the present invention provide a wire-wound coil device and a method for manufacturing the same, in which reliable mounting is achieved by providing large electrode areas even when the size of the coil device is reduced, and a high Q factor in the coil device is maintained.

According to an aspect of preferred embodiments of the present invention, a coil device includes a core including a reel and a pair of flanges provided at the ends of the reel, a terminal electrode disposed on each of the flanges of the core, and a wire wound around the reel of the core, thereby defining a coil, each end of the wire being connected to the terminal electrode. The terminal electrode includes a bottom-surface electrode provided on a bottom surface of the flange, side-surface electrodes provided on side surfaces of the flange, and an end-surface electrode provided at the lower part of an end surface of the flange. The end-surface electrode is provided on the end surface of the flange so that the upper edge of the end-surface electrode is disposed at a first level which is substantially the same as that of the upper edges of the side-surface electrodes in the vicinity of the boundaries between the end surface and each side surface of the flange and is disposed at a second level lower than the first level at an approximate center of the end surface of the flange, whereby the end-surface electrode avoids the majority of magnetic fluxes passing in an axial direction of the coil.

Each terminal electrode includes the bottom-surface electrode provided on the bottom surface of the flange, the side-surface electrodes provided on the side surfaces of the flange, and the end-surface electrode provided at the lower part of the end surface of the flange. The end-surface electrode is arranged at substantially the same height as the side-surface electrodes in the vicinity of the boundaries between the end surface and each side surface of the flange, and the end-surface electrode is arranged lower in height than the side-surface electrodes in the vicinity of the boundaries therebetween at a center of the end surface of the flange. With this configuration, an area of each terminal electrode for achieving sufficient adhesion for mounting is provided. Further, because the end-surface electrode is located spaced from the major portion of magnetic fluxes passing in an axial direction of the coil, the magnetic fluxes are not adversely affected by the end-surface electrode. With this arrangement, a high Q factor is achieved.

According to preferred embodiments of the present invention, the Q-value and the area of the terminal electrodes are balanced, and the adhesion for mounting is improved without adversely affecting the Q factor.

According to preferred embodiments of the present invention, each flange of the pair of flanges is provided with two legs at the lower portion thereof, the two legs being provided by dividing the lower portion of the flange into two parts by a groove, and being provided with the above-described terminal electrodes.

The present invention may be applied to a four-terminal-type coil device having a configuration in which each of a pair of flanges includes two legs at the lower portion thereof. This four-terminal-type coil device has terminal electrodes that operate in the same manner as the terminal electrodes of the above-described coil device according to preferred embodiments of the present invention.

According to another preferred embodiment of the present invention, a method for manufacturing a coil device is provided, the coil device including a core having a reel and a pair of flanges provided at the ends of the reel, a terminal electrode disposed on each of the flanges of the core, and a wire wound around the reel of the core, thereby forming a coil, each end of the wire being connected to the terminal electrode. The method includes the steps of providing a conductive paste for forming the terminal electrodes at a desired thickness on a substantially planar surface of a conductive-paste supporting member, dipping the core in a conductive paste layer provided on the conductive-paste supporting member, and moving back and forth at least one of the conductive-paste supporting member and the core in a direction substantially parallel to an end surface of the flange and the substantially planar surface of the conductive-paste supporting member provided with the conductive paste, thereby coating a bottom surface, side surfaces, and the end surface of the flange with the conductive paste so that the upper edge of an area on which conductive paste has been applied on the end surface of the flange is disposed at a first level which is substantially the same as that of the upper edges of areas on which conductive paste has been applied on the side surfaces in the vicinity of the boundaries between the end surface and each side surface of the flange and is disposed at a second level lower than the first level at an approximate center of the end surface of the flange. The method also includes the step of forming terminal electrodes by baking the conductive paste provided on the core.

A coil device is effectively manufactured by the method according to preferred embodiments of the present invention in which the conductive paste for forming the terminal electrodes is formed to have a desired thickness on the substantially planar surface of the conductive-paste supporting member, the core is dipped in the conductive paste layer provided on the conductive-paste supporting member, and at least one of the conductive-paste supporting member and the core is moved back and forth in a direction substantially parallel to the end surface of the flange and the substantially planar surface of the conductive-paste supporting member provided with the conductive paste, whereby the bottom surface, the side surfaces, and the end surface of the flange are effectively coated with the conductive paste so that the upper edge of the conductive-paste-coated area on the end surface of the flange is disposed at the first level which is substantially the same as that of the upper edges of the conductive-paste-coated areas on the side surfaces in the vicinity of the boundaries between the end surface and each side surface of the flange and is disposed at the second level lower than the first level at a center of the end surface of the flange. Therefore, the coil device according to preferred embodiments of the present invention are efficiently manufactured.

In the method for manufacturing a coil device according to another preferred embodiment of the present invention, a plurality of the cores held by an adhesive and elastic sheet provided on a core-holding member are brought into contact with the surface of the conductive-paste supporting member provided with the conductive paste, and at least one of the conductive-paste supporting member and the core-holding member is moved back and forth in a direction substantially parallel to the end surface of the flange and the surface of the conductive-paste supporting member provided with the conductive paste, thereby applying the conductive paste to the flanges of each core.

When the conductive paste is applied to the flanges of each core by processes in which a plurality of the cores held by the adhesive and elastic sheet provided on the core-holding member are brought into contact with the surface of the conductive-paste supporting member provided with the conductive paste, and at least one of the conductive-paste supporting member and the core-holding member is moved back and forth in a direction substantially parallel to the end surface of the flange and the surface of the conductive-paste supporting member provided with the conductive paste, the adhesive and elastic sheet reduces the dimension variations of each core in the height direction, whereby the cores are prevented from breaking and are pressed to the conductive-paste supporting member by a uniform pressing force, thereby enabling application of the conductive paste to the cores in a desired pattern.

Other features, elements, characteristics and advantages of preferred embodiments of the present invention will become apparent from the following detailed description of preferred embodiments thereof with reference to the attached drawings.

DETAILED DESCRIPTION OF PREFERRED EMBODIMENTS

The features and advantages of the present invention will be apparent from the following detailed description of the preferred embodiment of the present invention.

Figure 1:
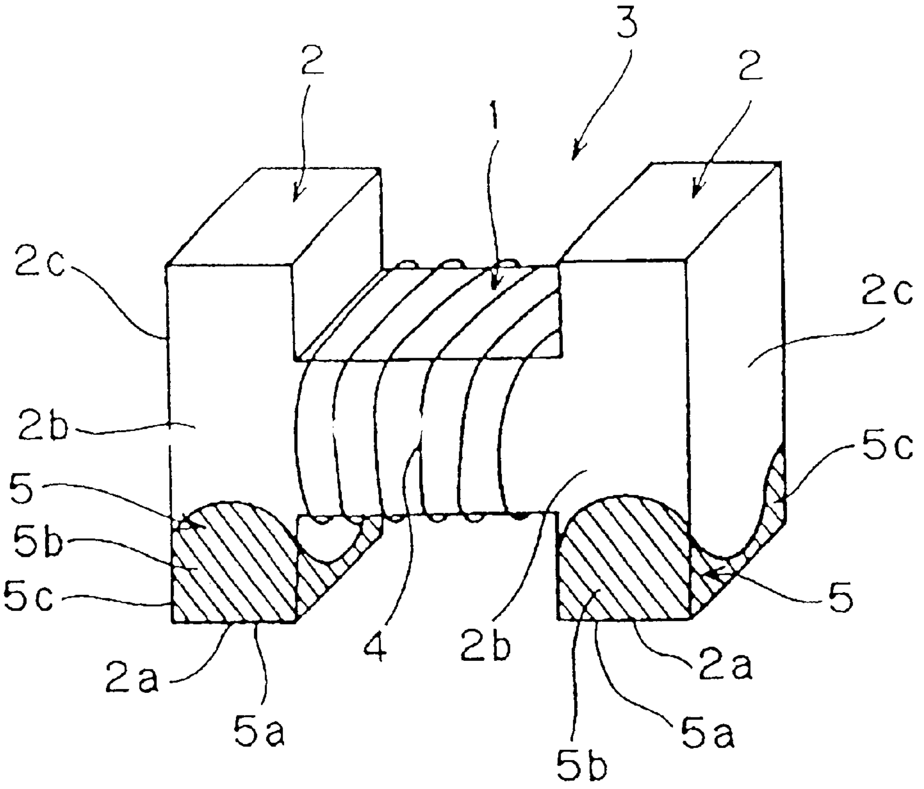
FIG. 1 is a schematic perspective view of a coil device according to a preferred embodiment of the present invention.

FIG. 1 is a schematic perspective view of a wire-wound coil device according to a preferred embodiment of the present invention.

In the coil device according to this preferred embodiment, a core 3 preferably includes a reel 1 and a pair of flanges 2 disposed at the ends of the reel 1. Each of the flanges 2 is provided with a terminal electrode 5. The reel 1 is wound with a wire 4, thereby defining a coil. Each end of the wire (coil) 4 is connected to one of the terminal electrodes 5 provided on the flanges 2 at the ends of the reel 1. The winding density of the coil, the length of the wire 4, and other factors are determined in accordance with the requirements for use, such as with respect to inductance.

In the coil device shown in FIG. 1, each terminal electrode 5 includes a bottom-surface electrode 5*a* provided on a bottom surface 2*a* of the flange 2, side-surface electrodes 5*b* provided at the lower portions of side surfaces 2*b* of the flange 2, and an end-surface electrode 5*c* provided at the lower portion of an end surface 2*c* of the flange 2. The end-surface electrode 5*c* has an upper edge substantially at the same level from the bottom surface 2*a* as the level of the upper edges of the side-surface electrodes 5*b* in the vicinity of the boundaries between the end surface 2*c* and each side surface 2*b*. The end-surface electrode 5*c* is arranged such that the upper edge thereof at an approximate central portion of the end surface 2*c* is lower in height than the upper edges of the side-surface electrodes 5*b* in the vicinity of the boundaries between the end surface 2*c* and each side surface 2*b*.

In the coil device according to this preferred embodiment of the present invention, each terminal electrode 5 includes the bottom-surface electrode 5*a*, the side-surface electrodes 5*b*, and the end-surface electrode 5*c*, thereby providing the electrodes 5 having a desired area, whereby mounting reliability is substantially improved. Since the end-surface electrodes 5*c* are provided having low upper edges at approximately central portions of the end surfaces 2*c*, the end-surface electrodes 5*c* are not substantially disposed on a line extending from the longitudinal axis of the reel 1, whereby the majority of magnetic fluxes passing along the axis of the coil 4 are not interrupted by the end-surface electrodes 5*c*. Thus, a high Q factor is maintained.

Generally, a coil device having flanges at the ends of a reel, such as the coil device according to the preferred embodiment, does not have high resistance against stress applied in a direction that is substantially perpendicular to the axis of the reel 1 (in the width direction), although it has strength against stress applied along the axis in the longitudinal direction of the reel 1. The side-surface electrodes 5*b* of the coil device according to the preferred embodiment of the present invention have sufficient area, thereby significantly improving the adhesion and the mounting reliability.

A method for manufacturing the above-described coil device is described below.

Figure 2:
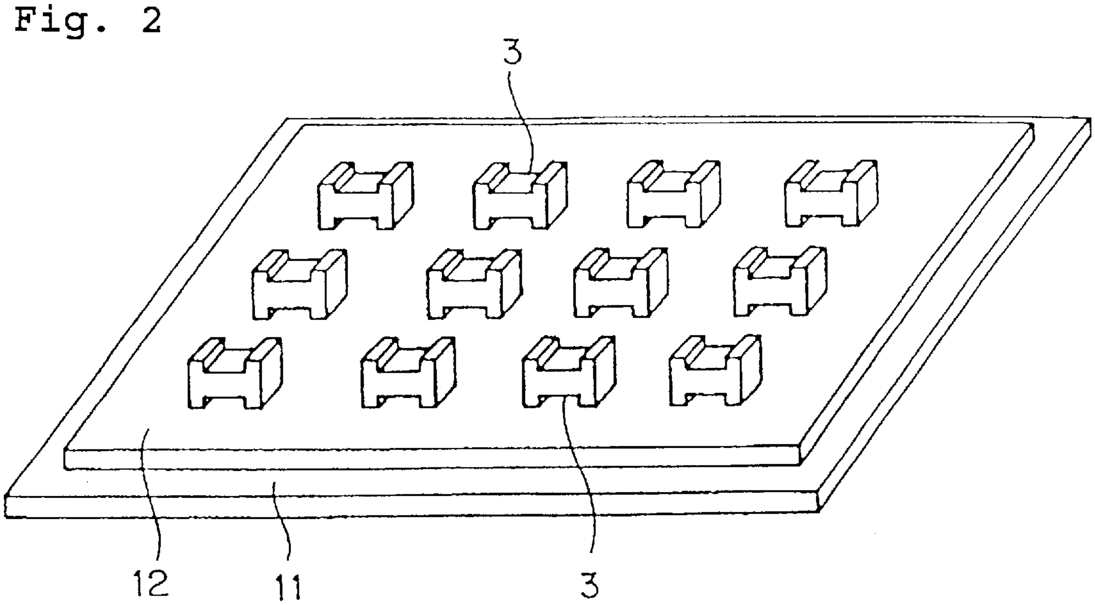
FIG. 2 is a perspective view of a plurality of cores arranged on an elastic adhesive sheet functioning as a holding medium in a manufacturing process for the coil device according to a preferred embodiment of the present invention.

As shown in FIG. 2, a plurality of the cores 3 are held on an elastic and adhesive sheet 12 provided on a surface of a core-holding member 11, each core 3 having dimensions that are preferably equal to or less than approximately 2.0 mm×1.2 mm×1.2 mm, and each core 3 preferably having the same dimensions.

Figure 3:
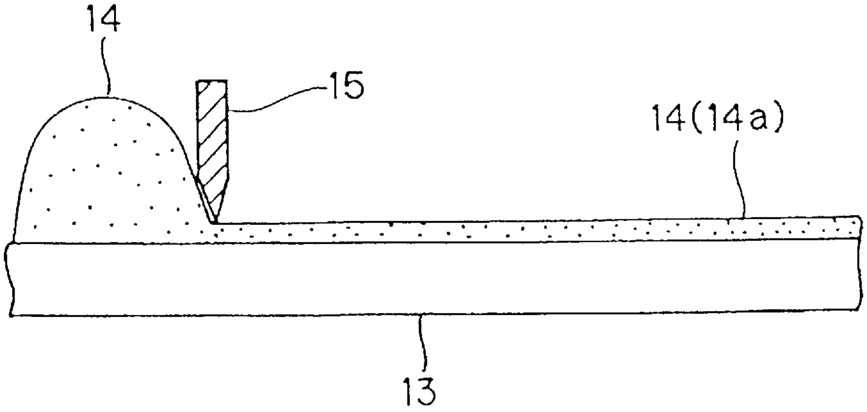
FIG. 3 is a sectional view of a state in which a conductive paste layer is formed on a conductive-paste supporting member in a manufacturing process for the coil device according to a preferred embodiment of the present invention.

As shown in FIG. 3, a conductive paste layer 14(14*a*) having a thickness of, for example, approximately 200 μm or less is provided on a flat upper surface of a conductive-paste supporting member 13 by squeezing a conductive paste 14 (Ag-paste in the present preferred embodiment) by using a squeegee 15 to form terminal electrodes. The conductive paste 14 preferably has a viscosity ranging from approximately 20 Pa·s to about 60 Pa·s.

Figure 4A:
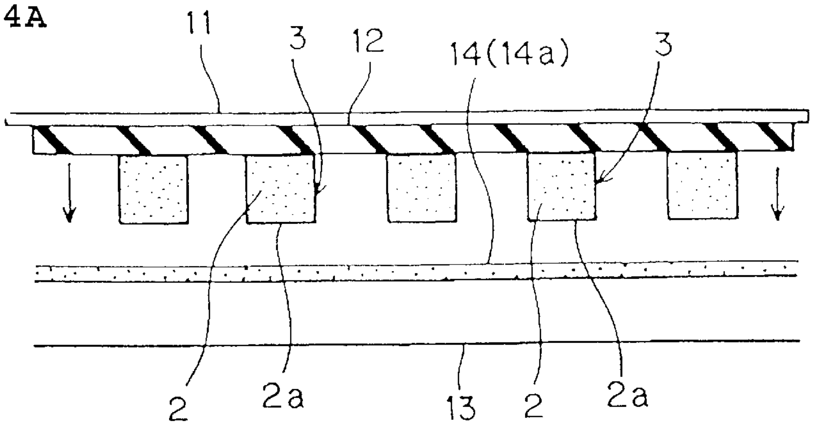
FIG. 4A is a sectional view of the plurality of cores held on the elastic adhesive sheet as a core-holding member before being dipped into the conductive paste layer formed on the conductive-paste supporting member.
Figure 4B:
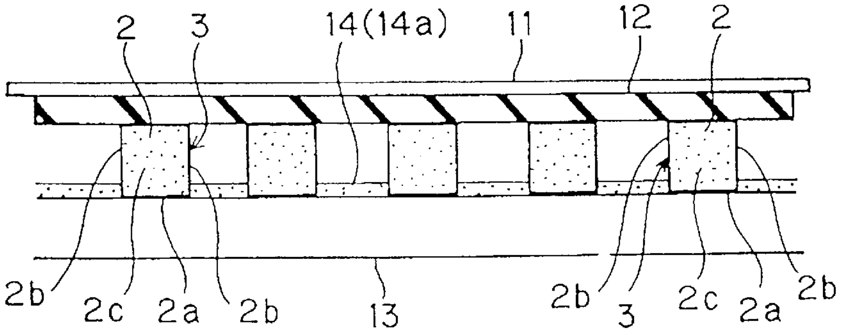
FIG. 4B is a sectional view of the plurality of cores being lowered so as to be dipped in the conductive paste layer and brought into contact with the conductive-paste supporting member.

The core-holding member 11 is disposed with the elastic-adhesive sheet 12 in a downward position to oppose the conductive-paste supporting member 13, as shown in FIG. 4A, and as shown in FIG. 4B, the core-holding member 11 is moved downwardly so that the cores 3 are brought into slight contact with the upper surface of the conductive-paste supporting member 13 through the conductive paste layer 14(14*a*). Since the elastic-adhesive sheet 12 flexibly contacts the cores 3, the dimension variations of each core 3 in the height direction are reduced, whereby the cores 3 are abutted to the upper surface of the conductive-paste supporting member 13 with substantially the same pressing force. Thus, the bottom surfaces 2*a* of the flanges 2 are coated with the conductive paste 14.

Figure 5:
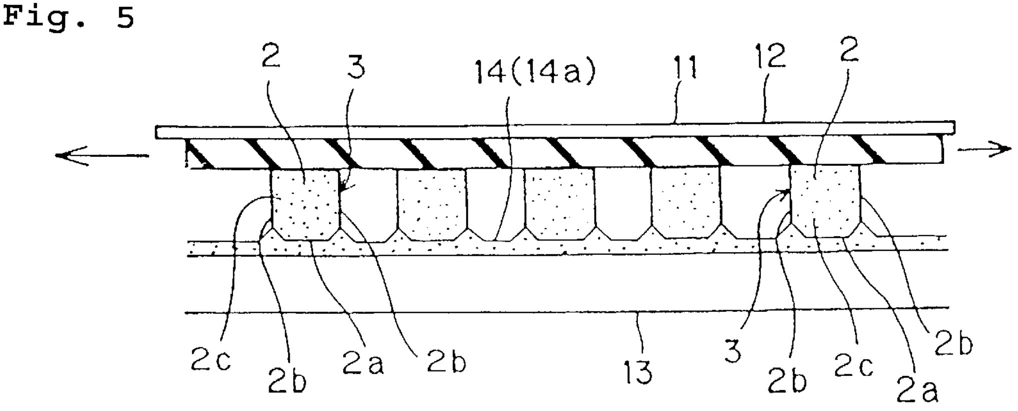
FIG. 5 is a sectional view of a state in which the conductive-paste supporting member is moved back and forth while the cores are brought into contact with the conductive-paste supporting member, so that flanges of the cores are coated with the conductive paste, in a manufacturing process for the coil device according to a preferred embodiment of the present invention.
Figure 6:
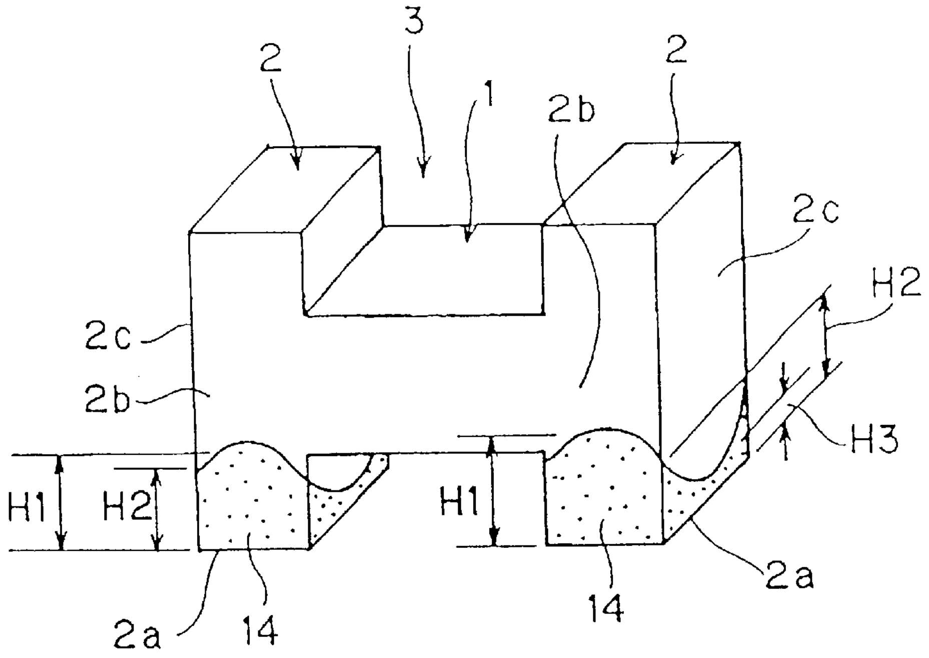
FIG. 6 is a perspective view of a core coated with the conductive paste at the flanges thereof in a manufacturing process of the coil device according to a preferred embodiment of the present invention.

Then, as shown in FIG. 5, the conductive-paste supporting member 13 is moved back and forth in an amplitude of approximately 0.1 mm to about 5 mm in a direction substantially parallel to the end surfaces 2*c* of the flanges 2 and to the surface coated with the conductive paste 14 of the conductive-paste supporting member 13 (in the width direction of the core 3). In this case, the conductive paste 14 or the conductive paste layer 14(14*a*) around each flange 2 is raised by each side surface 2*b* of the flanges 2 so that, as shown in FIG. 6, each side surface 2*b* of the flanges 2 of the cores 3 is coated with the conductive paste 14 up to a relatively high level of the side surface 2*b*. Each flange 2 is coated with the conductive paste 14 on the end surface 2*c* in the vicinity of the boundaries with the side surfaces 2*b* up to a height H2 which is substantially the same level as a height H1 of an area, coated with the conductive paste 14, of each side surface 2*b*. Further, each flange 2 is coated with the conductive paste 14 at an approximately central portion of the end surface 2*c*, up to a height H3 which is lower than the height H2 of the conductive paste 14 in the vicinity of the boundaries with the side surfaces 2*b*. With this arrangement, the conductive paste 14 is not disposed intersecting the line extending along the longitudinal axis of the reel 1.

According to the present preferred embodiment, the amplitude of the back-and-forth movement of the conductive-paste supporting member 13 ranges from approximately 0.1 mm to about 5 mm. This is because the conductive paste 14 or the conductive paste layer 14(14*a*) is not sufficiently raised when the amplitude is less than approximately 0.1 mm. As a result, the conductive paste 14 is not applied so as to have a desired height, and when the amplitude exceeds approximately 5 mm, the conductive paste 14 is deposited to a level that is too high, thereby causing problem with the magnetic fluxes.

After the process of applying the conductive paste 14 is completed, the core-holding member 11 is lifted upward.

The core 3 shown in FIG. 6, of which the flanges are coated with the conductive paste 14, is dried and heat-treated, thereby baking the conductive paste 14, and is plated with Ni (nickel) and Sn (tin). The reel 1 of the core 3 is wound with a wire, the ends of the wire being soldered to terminal electrodes, whereby the coil device shown in FIG. 1 is obtained.

The weather resistance and moisture resistance of the coil device is improved by coating the upper part including the reel 1 of the core 3 with an insulating resin, thereby further improving reliability.

As described above, the core 3 is efficiently coated with the conductive paste 14 in a desired pattern, in which a plurality of the cores 3 are held on the elastic-adhesive sheet 12 provided on the core-holding member 11, the cores 3 are brought into contact with the conductive-paste supporting member 13 through the conductive paste layer 14(14*a*), and the conductive-paste supporting member 13 is moved back and forth in the width direction of the core 3, thereby coating the flanges 2 of the cores 3 with the conductive paste 14. It is not necessary to hold the coil devices to be inclined or to use a particular conductive-paste-applying apparatus for forming electrodes having the edges thereof at different height levels as in the conventional methods for manufacturing coil devices. Each flange 2 is coated with the conductive paste 14 on the end surface 2*c* in the vicinity of the boundaries with the side surfaces 2*b* up to the height H2 which is substantially the same level as the height H1 of the area of each side surface 2*b* coated with the conductive paste 14, and at an approximately central portion of the end surface 2*c* up to the height H3 which is lower than the height H2 of the conductive paste 14 in the vicinity of the boundaries with each side surface 2*b*. With this arrangement, the conductive paste 14 is not arranged to intersect the line extending along the longitudinal axis of the reel 1.

The core 3 thus manufactured, as shown in FIG. 1, includes the terminal electrodes 5 each having the bottom-surface electrode 5*a*, the side-surface electrodes 5*b*, and the end-surface electrode 5*c* which provide a large area of the electrodes 5, thereby improving adhesion strength when mounting. The end-surface electrode 5*c* on the end surface 2*c* of each flange 2 is provided so that the upper edge of the end-surface electrode 5*c* is disposed lower at an approximate central portion of the end surface 2*c*, whereby the end-surface electrode 5*c* does not substantially intersect the line extending from the longitudinal axis of the reel 1. Therefore, the end-surface electrodes 5 do not interrupt the majority of magnetic fluxes passing along the longitudinal axis of the coil 4, whereby a coil device having a high Q factor is obtained.

In the method for manufacturing coil devices according to preferred embodiments of the present invention, the terminal electrodes in a desired pattern can be effectively provided on a small coil device having dimensions, for example, of approximately 1.0 mm (length)×0.5 mm (width)×0.5 mm (thickness), and the coil device having desired characteristics is effectively manufactured.

Figure 7:
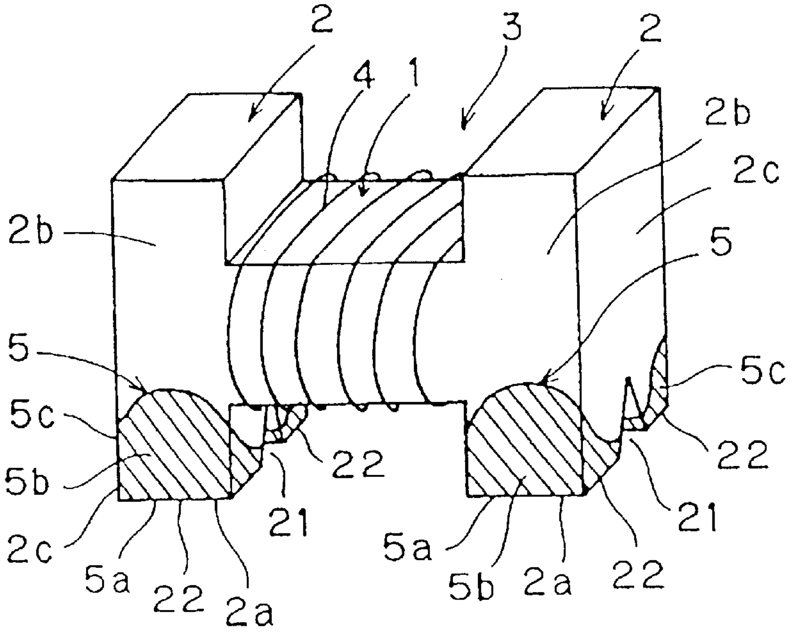
FIG. 7 is a perspective view of another preferred embodiment of the coil device according to the present invention.
Figure 8:
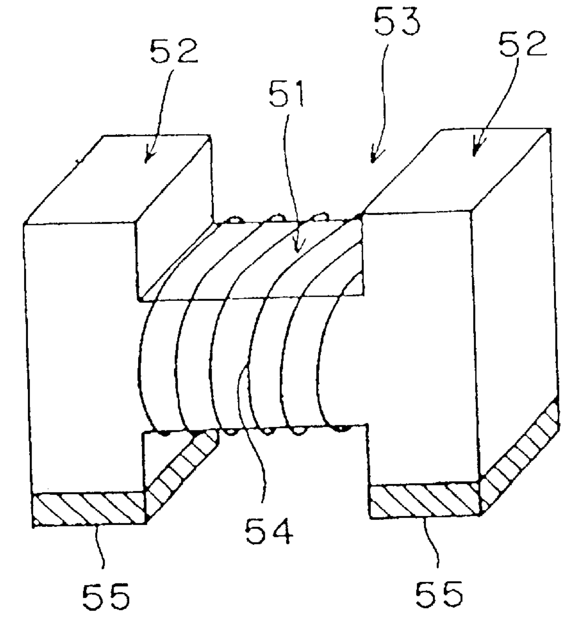
Fig. 8 PRIOR ART
FIG. 8 is a perspective view of a known coil device.
Figure 9:
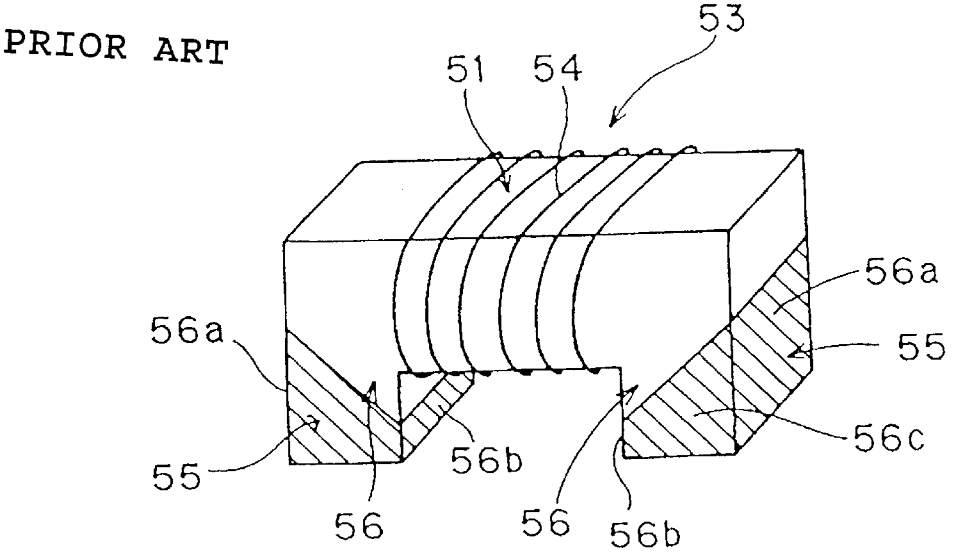
Fig. 9 PRIOR ART
FIG. 9 is a perspective view of another known coil device.
Figure 10:
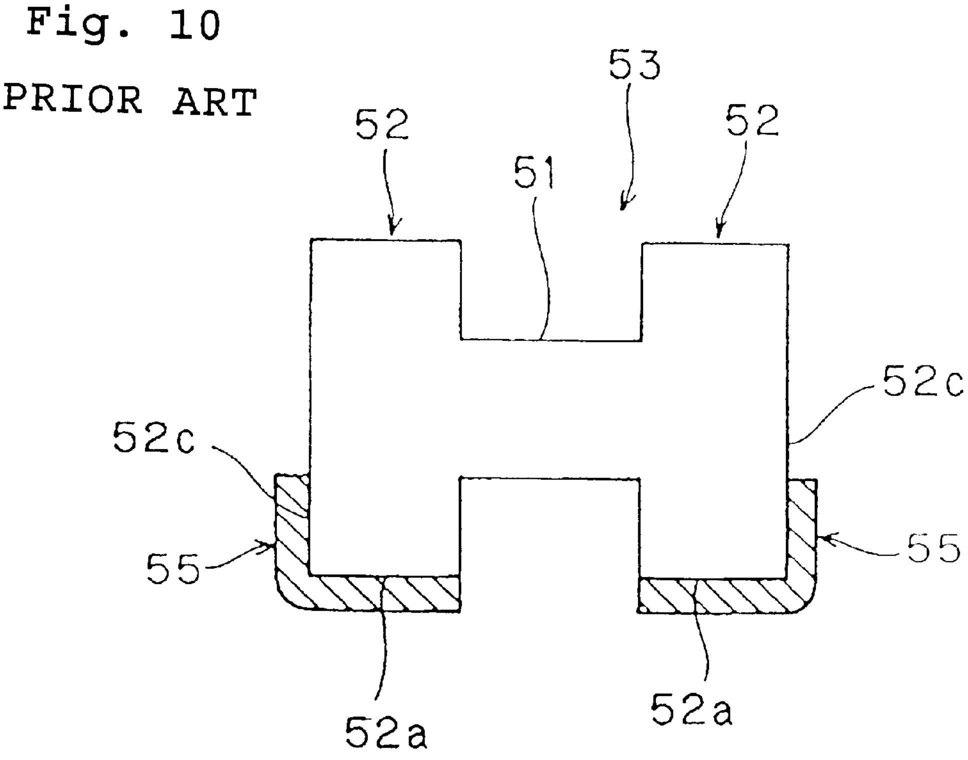
Fig. 10 PRIOR ART
FIG. 10 is a sectional view of another known coil device.

The present invention may be applied to a four-terminal-type coil device shown in FIG. 7, in which legs 22 at the lower portion of the flanges 2 are provided with grooves 21 at the lower portion of each flange 2. In FIG. 7, the same components or the components having the same functions as those of the components shown in FIG. 1 are referred to with the same reference numerals.

In the above-described preferred embodiments, an Ag (silver) paste is used as the conductive paste for forming the terminal electrodes. However, the conductive paste is not limited to the Ag paste, and it may be made from any other suitable material having various conductive components.

Although a squeegee method is used in the above-described preferred embodiment for forming the conductive paste layer on the conductive-paste supporting member, the method for forming the conductive paste layer is not limited to this method, and any other suitable method may be used.

In the preferred embodiment described above, although the conductive-paste supporting member is moved back and forth to apply the conductive paste on the flanges of the cores, the core-holding member instead of the conductive-paste supporting member may be moved back and forth, or both the conductive-paste supporting member and the core-holding member may be moved.

The present invention is not limited to the above-described embodiments regarding the aspects other than those that are described above. The shape of the cores, the pattern of the terminal electrodes, and other factors may be modified within the spirit and scope of the present invention.

As described above, in the coil device according to preferred embodiments of the present invention, each terminal electrode includes the bottom-surface electrode provided on the bottom surface of the flange, the side-surface electrodes provided on the side surfaces of the flange, and the end-surface electrode provided on the end surface of the flange at the lower portion of the end surface, and the end-surface electrode is provided on the end surface of the flange so that the upper edge of the end-surface electrode is disposed at the first level which is substantially the same as that of the upper edges of the side-surface electrodes in the vicinity of boundaries between the end surface and each side surface of the flange and is disposed at the second level lower than the first level at an approximately central portion of the end surface of the flange. With this arrangement, the area of each terminal electrode is provided to allow sufficient adhesion for mounting, and the end-surface electrode is located spaced from the majority of magnetic fluxes passing in a direction of the longitudinal axis of the coil so as not to interfere with the magnetic fluxes. With this arrangement, a high Q factor is maintained. Further according to the present invention, the Q-value and the area of the terminal electrodes are balanced, and the mounting adhesion is improved without degrading the Q factor.

The present invention can be applied to a four-terminal-type coil device having a configuration in which each of a pair of flanges includes two legs at the lower part thereof. This four-terminal-type coil device has terminal electrodes that operate in the same manner as the terminal electrodes of the above-described coil device according to the invention.

In a method for manufacturing a coil device according to preferred embodiments of the present invention, the conductive paste for forming the terminal electrodes is provided at a desired thickness on the substantially planar surface of the conductive-paste supporting member, the core is dipped in the conductive paste layer provided on the conductive-paste supporting member, and at least one of the conductive-paste supporting member and the core is moved back and forth in a direction substantially parallel to the end surface of the flange and the substantially planar surface of the conductive-paste supporting member provided with the conductive paste. With this arrangement, the bottom surface, the side surfaces, and the end surface of the flange are effectively coated with the conductive paste so that the upper edge of the conductive-paste-coated area on the end surface of the flange is disposed at the first level which is substantially the same as that of the upper edges of the conductive-paste-coated areas on the side surfaces in the vicinity of the boundaries between the end surface and each side surface of the flange and is disposed at the second level lower than the first level at a center of the end surface of the flange, thereby enabling efficient manufacture of the coil device according to preferred embodiments of the present invention.

In the method for manufacturing a coil device according to preferred embodiments of the present invention, the conductive paste is provided on the flanges of each core by processes in which a plurality of the cores held by the adhesive and elastic sheet provided on the core-holding member are brought into contact with the surface of the conductive-paste supporting member provided with the conductive paste, and at least one of the conductive-paste supporting member and the core-holding member is moved back and forth in a direction substantially parallel to the end surface of the flange and the surface of the conductive-paste supporting member provided with the conductive paste, the adhesive and elastic sheet absorbs the variation in the thickness of each core, whereby the cores are prevented from breaking and can be pressed to the conductive-paste supporting member by a uniform pressing force, thereby enabling application of the conductive paste to the cores in a desired pattern.

It should be understood that the foregoing description of preferred embodiments is only illustrative of the present invention. Various alternatives and modifications can be devised by those skilled in the art without departing from the invention. Accordingly, the present invention is intended to embrace all such alternatives, modifications and variations that fall within the scope of the appended claims.

What is claimed is:

1. A method for manufacturing a coil device comprising a core including a reel and a pair of flanges provided at the ends of the reel, a terminal electrode disposed on each of the flanges of the core, and a wire wound around the reel of the core, thereby forming a coil, each end of the wire being connected to the terminal electrode, the method comprising the steps of:

providing a conductive paste for forming the terminal electrodes at a desired thickness on a substantially planar surface of a conductive-paste supporting member;

dipping the core in a conductive paste layer provided on the conductive-paste supporting member; and moving back and forth at least one of the conductive-paste supporting member and the core in a direction substantially parallel to an end surface of the flanges and the substantially planar surface of the conductive-paste supporting member provided with the conductive paste, thereby coating a bottom surface, side surfaces, and the end surface of the flanges with the conductive paste so that the upper edge of a conductive-paste coated area on the end surface of the flanges is disposed at a first level which is substantially the same height as the upper edges of conductive-paste coated areas on the side surfaces in the vicinity of the boundaries between the end surface and each side surface of the flanges and is disposed at a second level lower than the first level at an approximate center of the end surface of the flanges; and forming terminal electrodes by baking the conductive paste provided on the core.

2. A method for manufacturing a coil device according to claim 1, further including the steps of:

providing a core-holding member having an adhesive and elastic sheet;

holding a plurality of the cores by the adhesive and elastic sheet;

bringing the plurality of the cores into contact with the surface of the conductive-paste supporting member provided with the conductive paste; and moving at least one of the conductive-paste supporting member and the core-holding member back and forth in a direction substantially parallel to the end surface of the flanges and the substantially planar surface of the conductive-paste supporting member provided with the conductive paste, thereby providing the conductive paste on the flanges of each core.

3. A method of manufacturing a coil device according to claim 2, wherein each of the plurality of cores have approximately the same dimensions.

4. A method of manufacturing a coil device according to claim 2, wherein the step of moving at least one of the conductive-paste supporting member and the core-holding member back and forth comprises moving both the conductive-paste supporting member and the core-holding member back and forth.

5. A method of manufacturing a coil device according to claim 2, wherein the step of moving at least one of the conductive-paste supporting member and the core-holding member back and forth comprises moving only the core-holding member back and forth.

6. A method for manufacturing a coil device according to claim 1, wherein the conductive paste is spread on the conductive-paste supporting member using a squeegee.

7. A method of manufacturing a coil device according to claim 1, wherein the conductive paste is spread on the conductive-paste supporting member to a thickness of approximately 200 $\mu$m or less.

8. A method of manufacturing a coil device according to claim 1, wherein the conductive paste has a viscosity ranging from approximately 20 Pa·s to about 60 Pa·s.

9. A method of manufacturing a coil device according to claim 1, wherein the amplitude of the movement performed in the step of moving back and forth at least one of the conductive-paste supporting member and the core is between approximately 0.1 mm and about 5.0 mm.

10. A method of manufacturing a coil device according to claim 1, wherein the step of moving back and forth at least one of the conductive-paste supporting member and the core comprises moving back and forth only the conductive-paste supporting member.

11. A method of manufacturing a coil device according to claim 1, wherein the step of moving back and forth at least one of the conductive-paste supporting member and the core comprises moving back and forth only the core.

12. A method of manufacturing a coil device according to claim 1, wherein the step of moving back and forth at least one of the conductive-paste supporting member and the core comprises moving back and forth both the conductive-paste supporting member and the core.

13. A method of manufacturing a coil device according to claim 1, wherein the conductive paste is Ag paste.

14. A method of manufacturing a coil device according to claim 1, wherein the coil device has overall dimensions of approximately 1.0 mm (length)×0.5 mm (height)×0.5 mm (thickness).

15. A method of manufacturing a coil device according to claim 1, further including the steps of:

forming a groove in the lower portion of the flanges of the core, wherein the lower portion of each of the flanges are dipped in the conductive paste to form the external electrodes thereon.

* * * * *